United States Patent [19]
Womack

[11] Patent Number: 5,614,763
[45] Date of Patent: Mar. 25, 1997

[54] METHODS FOR IMPROVING PERFORMANCE AND TEMPERATURE ROBUSTNESS OF OPTICAL COUPLING BETWEEN SOLID STATE LIGHT SENSORS AND OPTICAL SYSTEMS

[75] Inventor: Gary L. Womack, Tucson, Ariz.

[73] Assignee: Zetetic Institute, Tucson, Ariz.

[21] Appl. No.: 403,224

[22] Filed: Mar. 13, 1995

[51] Int. Cl.$^6$ ............................ H01L 23/48; H01L 23/52; H01L 29/40
[52] U.S. Cl. ............................................. 257/747; 257/432
[58] Field of Search ....................... 257/747, 432, 257/433, 706, 707, 713, 719, 717, 705

[56] References Cited

U.S. PATENT DOCUMENTS

| | | | |
|---|---|---|---|
| 3,969,754 | 7/1976 | Kuniya et al. | 257/747 |
| 4,556,899 | 12/1985 | Kunhara et al. | 257/701 |
| 4,788,627 | 11/1988 | Ebert et al. | 257/747 |
| 4,872,047 | 10/1989 | Fister et al. | 257/747 |
| 4,884,124 | 11/1989 | Mori et al. | 357/72 |
| 4,916,442 | 4/1980 | Kuniya et al. | 257/747 |
| 4,942,454 | 7/1990 | Mori et al. | 357/70 |
| 4,962,416 | 10/1990 | Jones et al. | 357/81 |
| 5,134,680 | 7/1992 | Schempp | 385/116 |
| 5,172,301 | 12/1992 | Schneider | 361/386 |
| 5,252,850 | 10/1993 | Schempp | 257/433 |

FOREIGN PATENT DOCUMENTS

| | | | |
|---|---|---|---|
| 59-31034 | 2/1984 | Japan | 257/747 |
| 5-121587 | 5/1993 | Japan | 257/747 |

Primary Examiner—Stephen Meier
Assistant Examiner—S. V. Clark
Attorney, Agent, or Firm—Cahill, Sutton & Thomas P.L.C.

[57] ABSTRACT

A high resolution optical coupling device includes optical coupling material bonded to a CCD wafer surface and a fiber optic bundle. The CCD wafer is bonded to a substrate, and a thermal compensation plate is bonded to an opposite face thereof to compensate effects of differential thermal contraction and expansion of the CCD wafer and substrate. Substrate-adjusting elements engage the substrate to shape the CCD wafer surface to match a mating surface of a fiber optic bundle before the thermal compensation plate is attached to the substrate. A null fringe pattern of an interferometer indicates when a perfect match is achieved. A thin layer of optical coupling material then is used to bond the CCD surface to the matching surface of the optic fiber bundle. Thermal compensation material can be included in a rigid hermetic seal structure between the substrate and the fiber optic bundle to reduce bonding interface shear stress in the optical coupling material due to volume changes thereof during thermal cycling. The optical coupling material also can be prestressed before curing of the hermetic seal structure to reduce such shear stresses during thermal cycling.

14 Claims, 11 Drawing Sheets

METHODS FOR IMPROVING PERFORMANCE AND TEMPERATURE ROBUSTNESS OF OPTICAL COUPLING BETWEEN SOLID STATE LIGHT SENSORS AND OPTICAL SYSTEMS

BACKGROUND OF THE INVENTION

This invention relates generally to improvements in high resolution optical coupling devices, and more particularly to such devices which employ arrays of solid state photosensitive elements, such as charge-coupled devices (CCDs).

Solid state cameras are available both for laboratory and commercial use. Such cameras also are used for x-ray imaging when the x-ray image is arranged to impinge on a phosphor screen. The phosphor screen produces a corresponding light image that is transferred to a light sensor by an optical system. In order to obtain the highest performance of the camera, it usually is desirable to have the light sensor optically coupled via a bonding agent to the last optical element of the optical system and to operate the light sensor below room temperature. (As used herein, the term "last optical element" refers to the optical element (such as a fiber optic bundle, lens, or image intensifier) that is coupled by the bonding agent to the light sensor.)

In the case where the solid state camera employs a CCD array, it generally is assumed that the shape of the light-receiving face of the CCD wafer is spherical, and the mating face of the last optical element is shaped to match the assumed spherical shape of the CCD wafer. The substrate and CCD wafer generally are attached via a bonding agent that cures or sets at a temperature elevated above room temperature. The substrate material of a CCD ordinarily has a thermal coefficient of expansion which is different from that of the CCD wafer. As the CCD/substrate unit is cooled to room temperature, the difference in the thermal coefficients of expansion cause the CCD/substrate assembly to become either convex or concave, as observed from the CCD wafer side thereof. Furthermore, cooling the CCD/substrate assembly to operate below room temperature causes the shape to become even more convex or more concave.

In a CCD camera wherein the CCD wafer is optically coupled to an optical system via an optical-coupling material such as an optical grade epoxy, cooling the CCD/substrate assembly leads to a tension type of stress in the edge regions of the optical-coupling material for a convex shape and in the central region of the optical-coupling element for a concave shape. The repeated stress cycles that result from cooling and warming as the camera system is turned on and off can lead to failure of the bonding of the optical-coupling material to the CCD and/or the mating element of the optical system.

FIG. 1 shows a prior art optical coupling device involving a fiber optic bundle 20 with a face shaped to match the assumed spherical shape of the CCD wafer 1 bonded to substrate 2. Optical-coupling material 4, which can be an optical grade epoxy such as EPO-TEK 301-2, optically couples CCD wafer 1 to the hopefully matching spherical shape of a fiber optic bundle 20, which is the mating "last optical element" of the optical system. Shaping the face of fiber optic bundle 20 leads to improved resolution. However, the light-receiving face of CCD wafer 1 typically is non-spherical. Thus, the optimum resolution of the camera system including the optical coupling device of FIG. 1 is not realized, since the non-sphericity of face of CCD wafer 1 is not accounted for in the optical coupling of the CCD wafer and the optical system.

Furthermore, many applications require high performance of the solid state camera system which can only be achieved by operating the CCD below room temperature. Since the optical coupling material itself has a thermal expansion coefficient typically one to two orders of magnitude larger than the thermal expansion coefficients of the CCD wafer/substrate material and fiber bundle or last optical element, such operation at low temperatures also generates considerable stress on the bonding at the optical-coupling material interfaces between the CCD wafer and the fiber optic bundle 20 or last optical element. Consequently, repeated thermal cycling often leads to failure of such interface bonding. Failure of the interface bonding of optical coupling material in turn causes a significant reduction the performance of the camera system and has a high probability of damaging the CCD wafer beyond repair.

Such failure can create serious economic loss as a result of downtime of the imaging instrument and the cost of replacement of an expensive CCD wafer. Furthermore, the medical profession cannot tolerate poor resolution in x-ray imaging.

Thus, there is an unmet need for a low cost structure and method for both (1) matching the shape of a CCD wafer to the shape of a fiber optic bundle 20 or other last optical element and (2) reducing or eliminating stress which occurs at the interfaces between the CCD wafer, last optical element, and the optical coupling material therebetween as a result of thermal cycling.

SUMMARY OF THE INVENTION

Accordingly, it is an object of the invention to provide improved techniques and structures for reducing interface bonding stresses between optical coupling material and the surfaces of a CCD wafer (or the like) and a mating optical element.

It is another object of the invention to provide an improved technique and structure for improving matching between the surface of an array of photosensitive elements and the surface of a mating optical element to obtain improved imaging resolutions.

It is another object of the invention to provide techniques and structures for avoiding interface bonding failures in an optical coupling element due to thermal cycling.

Briefly described, and in accordance with one embodiment thereof, the invention provides an optical coupling device including a CCD wafer bonded to a substrate and a thermal compensation plate bonded to an opposite surface of the substrate. The thermal compensation plate is selected to have a thermal coefficient of expansion and a thickness such that bowing of the substrate/CCD wafer unit due to differences in thermal expansion and contraction of the CCD wafer and substrate is compensated. In one embodiment of the invention, substrate-adjusting elements are used to develop localized forces on the substrate to produce localized "bowing" so as to provide a precisely predetermined surface shape of the CCD array before the thermal compensation plate is bonded to the back side of the substrate. One type of substrate-adjusting element produces Localized heating of the substrate to produce the desired localized bowing. Another type applies torque to peripheral portions of the substrate to produce the localized bowing. Another type includes an array of threaded pads adhesively attached to the substrate and a plurality of reference screws engaging the pads to produce localized forces on the back side of the substrate to produce the localized bowing. In one embodiment, the surface of the CCD wafer is used as the test surface in an interferometer, and the mating surface of the last optical element is used as the reference surface in the interferometer. The substrate-adjusting elements are operated so as to produce a null fringe pattern in an interferogram between the CCD surface and the mating surface of the last optical element so that the two surfaces are perfectly complementary to each other. The thermal compensating plate then is rigidly bonded to the back surface of the substrate to "fix" the matched shape of the CCD wafer. In one embodiment of the invention, thermal compensation material is included in a hermetic seal structure that mechanically couples the last optical element to the substrate to provide a hermetically sealed structure protecting wire bonds between the CCD wafer and leads associated with the substrate. The thermal compensation material adjusts the gap filled by optical coupling material between the surface of the CCD wafer and the mating surface of the last optical element so that when the optical coupling material thermally contracts due to cooling of the CCD wafer and associated structure (for example, to achieve low noise operation), the cross-sectional area of each "slice" of the optical coupling material parallel to the CCD surface remains essentially constant without introducing any shear stresses at the interfaces. consequently, shear stresses at the interfaces during thermal cycling of the structure are greatly reduced.

In another embodiment of the invention (in which thermal compensation material in the hermetic sealing structure may also be used if desired), an external bias force is applied to the substrate to press the CCD wafer against the already cured optical coupling material before one or more bonds associated with the hermetic seal structure are cured, producing an internal bias force in the optical coupling material which subsequently causes an internal bias in the shear stresses at the respective interfaces. The bonding material of the hermetic sealing structure then is cured and the external bias force is removed, whereby the hermetic sealing structure maintains the internal bias force and the internal bias shear stresses. Therefore, subsequent thermal cycling of the structure does not produce shear stresses at the interfaces between the surface of the CCD wafer and last optical element and the optical coupling material, as would occur if the internal bias force and the internal bias shear stresses were not present in the optical coupling material at room temperature.

In another embodiment of the invention (in which thermal compensation material in the hermetic sealing structure may also be used if desired), an external force is applied to the substrate to press the CCD wafer against the optical coupling material during the curing of the optical coupling material, and the external force is varied during the curing so as to maintain the cross-sectional area of each "slice" of the optical coupling material essentially constant. This procedure can considerably reduce the internal stresses in the bonding material and the stresses at the bond interfaces that arise because of the shrinkage of the bonding material that generally occurs during the curing.

DETAILED DESCRIPTION OF THE PREFERRED EMBODIMENTS

The invention is based on the realization that there are two major causes of failure of an optical coupling between a CCD wafer and an associated optical system, especially in a cooled, low noise CCD camera system. These causes include (1) changes in the shape of the CCD/substrate assembly that occur during thermal cycling, and (2) a large thermal coefficient of expansion for the optical coupling material. One embodiment of the invention is based on the fact that the face of a CCD/substrate assembly ordinarily is non-spherical in shape.

The thermal coefficient of expansion for the optical-coupling element is typically one to two orders of magnitude larger than the thermal coefficient of expansion for both the CCD wafer and the last optical element (e.g., a fiber optic bundle, lens, or image intensifier) that mates with the CCD wafer of the optical system. Therefore, stress is developed in the optical-coupling material as the temperature of the CCD wafer, optical-coupling material, and the last optical element is reduced. Such stress is significant in terms of the lap shear strength of the bonds at the interface with the CCD wafer and the interface with the mating optical element. Such stress usually presents a more serious problem than the stress due to change which occurs in the shape of the CCD/substrate assembly during thermal cycling.

Problems caused by changes in the shape of the CCD/substrate assembly during thermal cycling can be avoided by cementing on the back side of the CCD/substrate assembly (i.e., on the side of the substrate opposite to the CCD wafer) a layer of appropriate thermal compensation material that will compensate for the different thermal expansion coefficients of the CCD wafer and the substrate bonded thereto. If the low-temperature shape of the CCD/substrate assembly is basically convex, then the thermal compensation material needs to have a thermal coefficient of expansion that is approximately equal to or less than that of the CCD wafer. If the low-temperature shape of the CCD/substrate unit is basically concave, then the thermal compensation material needs to have a thermal coefficient of expansion that is approximately equal to or greater than that of the CCD wafer. The thickness of the thermal compensation material can be chosen so that bowing of the assembled CCD wafer, substrate, and backing material has greatly reduced sensitivity to a change in the temperature of the assembly.

Figure 1:
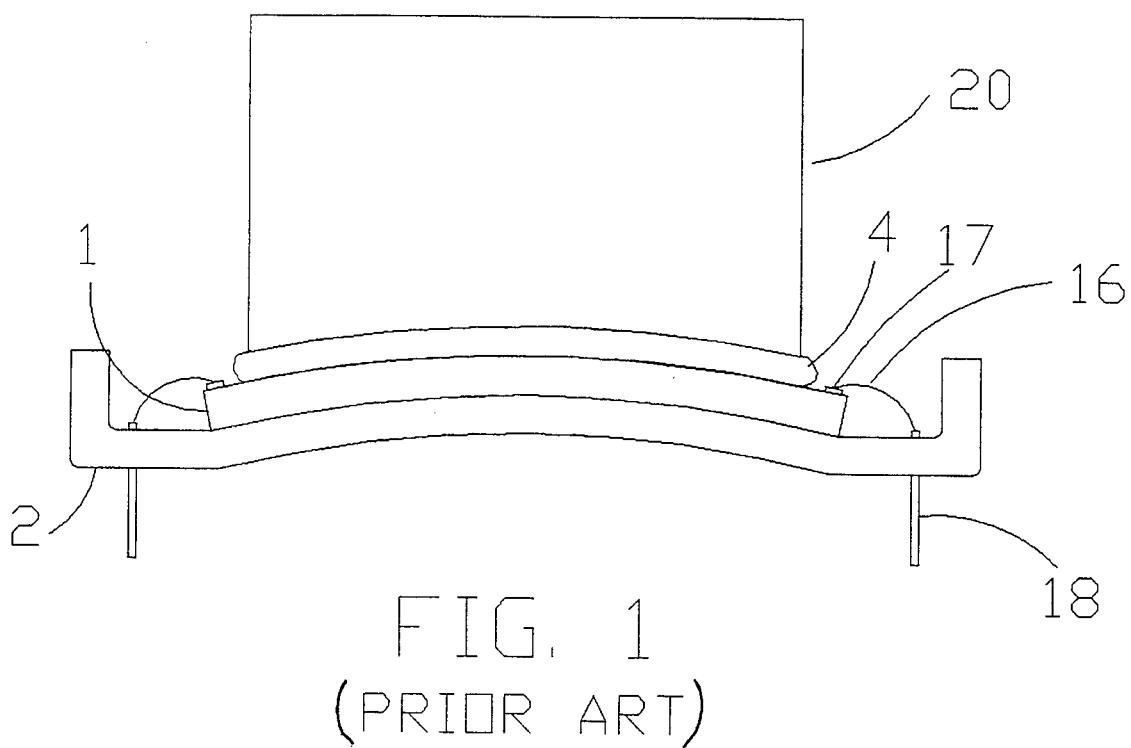
FIG. 1 shows a prior art bond between a CCD array and a mating optical element.
Figure 2:
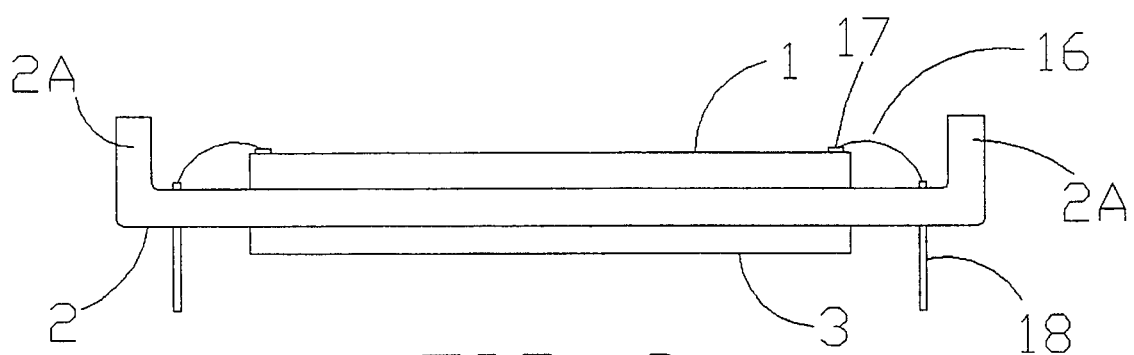
FIG. 2 illustrates the use of a thermal compensation plate on the back side of a CCD package.

FIG. 2 illustrates the use of a thermal compensation plate 3 bonded (for example, by means of Eccobond 285 or Epo-Tek 301) to the bottom surface of the substrate 2 to stabilize the shape of a CCD wafer 1 bonded to the top surface of substrate 2, which has a flange 2A extending upward to protect bond wires 16 connecting wire bond pads 17 of CCD wafer 1 to package leads 18. (Note that the same or similar reference numerals are used in the various figures to designate the same or similar components.) Typically, the thermal coefficient of expansion $\alpha_2$ of substrate 2 is larger than the thermal coefficient of expansion $\alpha_1$ of CCD wafer 1. In this case, the face of CCD wafer 1 becomes convex as the wafer and substrate assembly 1,2 is cooled. This is compensated by cementing thermal compensation plate 3 onto the bottom surface of substrate 2. Thermal compensation plate 3 can be made of material that has a thermal coefficient of expansion $\alpha_3$ which is less than $\alpha_2$. The thickness t3 of thermal compensation plate 3 required to temperature-stabilize the CCD/substrate/compensation plate assembly 1,2,3 is a function of $t_1, t_2, \alpha_1, \alpha_2, \alpha_3, E_1, E_2$, and $E_3$, where $E_n$ is the Young's modulus of elasticity of element n for n=1,2, or 3. In the prototype devices constructed to date, thermal compensation plate 3 has been composed of alumina ceramic with thicknesses of 0.64 millimeters, 0.84 millimeters and 1.14 millimeters.

At room temperature, the shape of the upper face of CCD wafer 1 typically is convex. It also is common to have $\alpha_2 > \alpha_1$, where the subscripts refer to the elements in FIG. 2. When these two conditions in fact are present, the difference between $\alpha_2$ and $\alpha_1$ can be used to partially or completely flatten the shape of the bonded CCD wafer 1 and substrate 2 by raising the temperature of this system before cementing thermal compensation plate 3 onto substrate 2 at the elevated temperature. When substrate 2 is composed of kovar, the "dishing" of the CCD face as the temperature changes can be reduced by approximately 6 microns with an increase in temperature of 25° C. for a CCD wafer 1 that is approximately 2.5 centimeters square.

It is desirable to match the shape of the face of the last optical element, e.g., fiber optic bundle 20, to the face of the CCD wafer so the size of the gap occupied by the optical-coupling element is less than or equal to about one-half of the size of the pixels of CCD wafer 1. For a CCD wafer with 9 micron pixels, the required gap width is less than or approximately equal to 4 microns. Under this condition, the modulation transfer function (MTF) of the fiber optic bundle 20, optical-coupling element 4, and CCD wafer 1 is degraded less than approximately 10% from that of the intrinsic MTF of the CCD system.

It clearly is cost-effective to change the face shape of fiber optic bundle 20 when the face shape of CCD wafer 1 is spherical. However, the face of CCD wafer 1 usually deviates significantly from a spherical shape. Such deviation can lead to degradation of the system MTF if the non-spherical CCD wafer face is optically coupled to a spherically shaped face of the fiber optic bundle. Unfortunately, the generation of non-spherical face shapes on the fiber optic bundle 20 is difficult and cost prohibitive in a manufacturing environment.

However, in accordance with the present invention it is possible to change the face shape of CCD wafer 1 (whether spherical or non-spherical) to match a predetermined face shape of fiber optic bundle 20. There are three different techniques that can be used. One technique employs temperature gradients introduced in the CCD wafer/substrate assembly by preferential heating of portions of the edges of the CCD wafer/substrate assembly package. A second technique employs a series of torques applied at the edges of the CCD wafer/substrate assembly to obtain a desired shape of the CCD wafer surface. The third technique that can be used to change the shape of the CCD surface involves setting up a matrix of tension/compression stresses on the back of the CCD substrate.

In the third technique, a matrix of n×n pads is bonded to the back of substrate 2 where each pad has been previously drilled and tapped. A reference plate is coupled to the pads with n×n reference screws of spring-screw units where each unit is made from two springs and a screw. The matrix of screws used in "push" or "pull" modes can be used to alter the face shape of the CCD.

Figure 3:
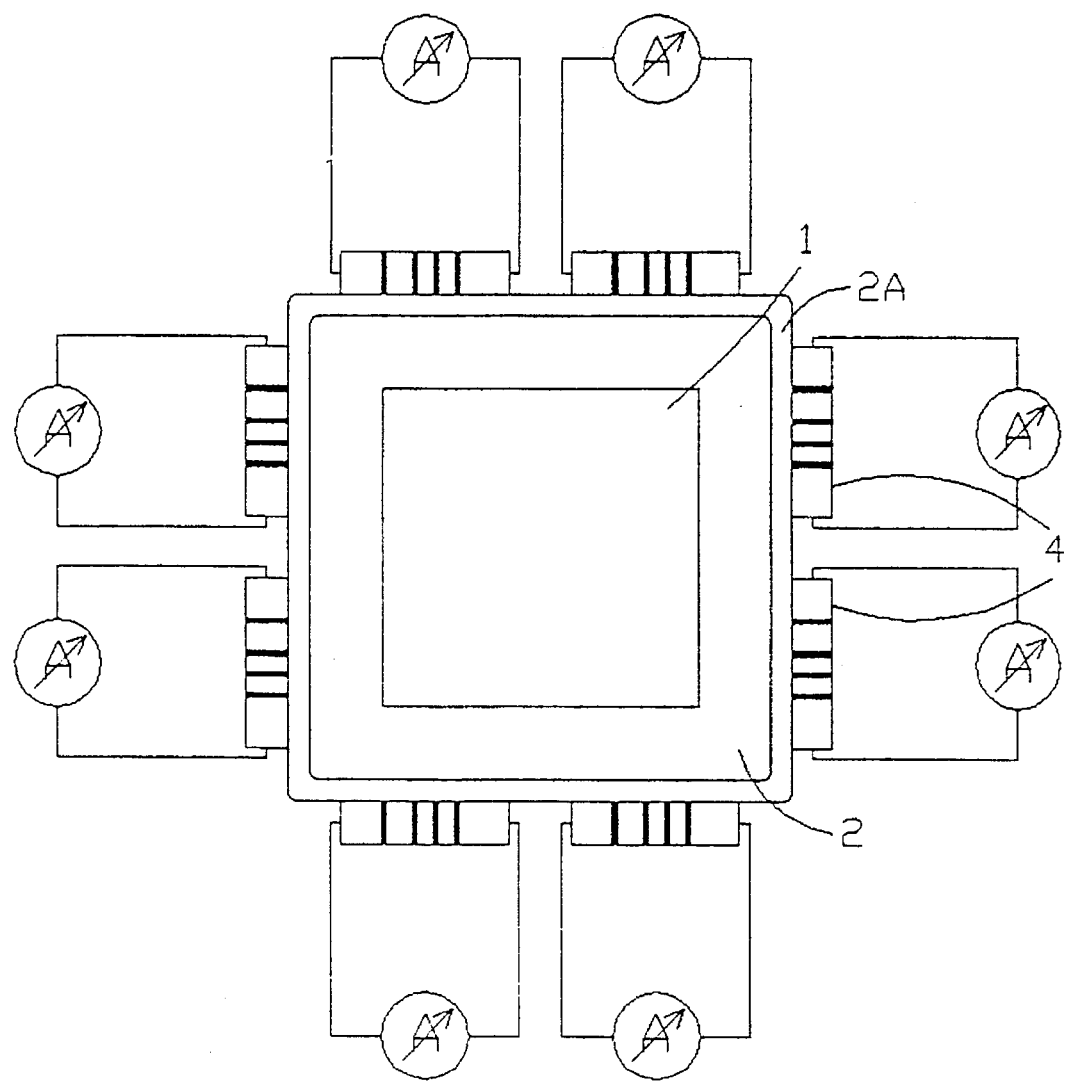
FIG. 3 illustrates the placement of a series of resistors around a CCD package and an associated control circuit for the purpose of creating desired temperature and temperature gradients.

In accordance with the present invention, it has been discovered that temperature gradients can be introduced in the substrate of CCD/substrate assembly 1,2 in order to produce changes that result in a shape different than the approximately spherical shape change produced by a uniform change in temperature of the CCD/substrate assembly. One method for introducing such temperature gradients in the package is by thermally coupling a number of heaters or resistors 4 to the edges 2A of substrate 2, as shown in FIG. 3 and manually or automatically adjusting the electrical power dissipated in each resistor so as to achieve the shape change desired.

Figure 4:
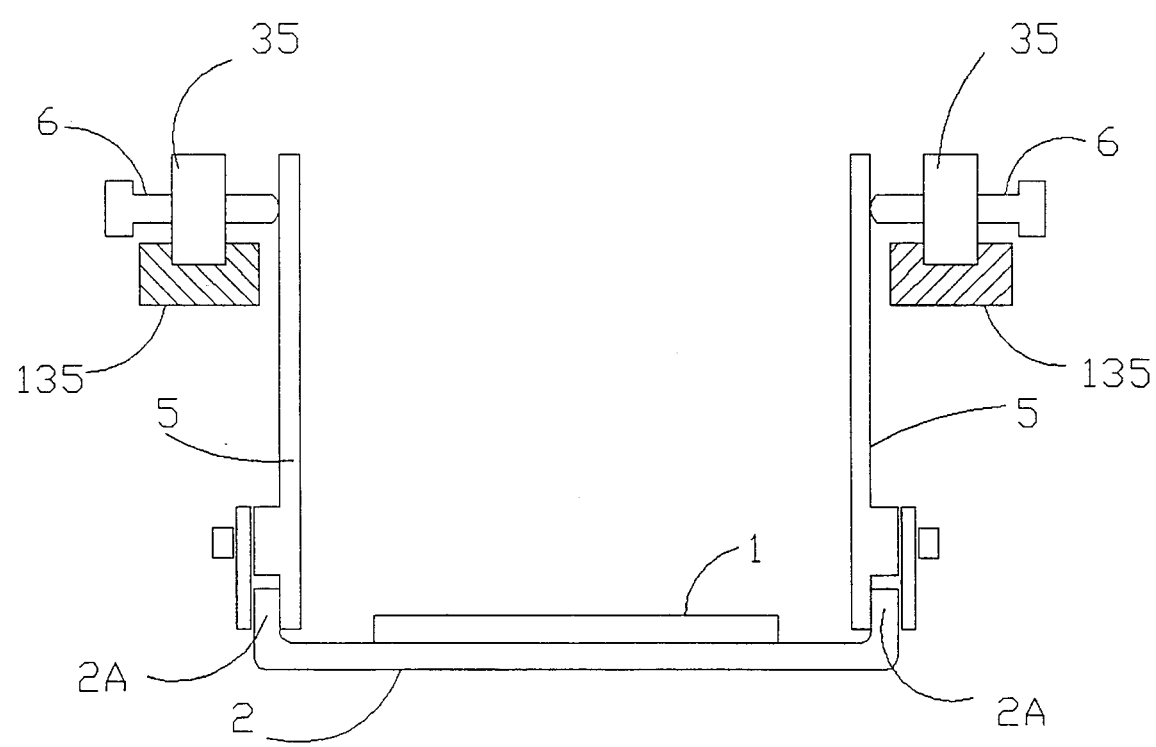
FIG. 4 displays the use of torque wrenches mechanically coupled to a CCD package.

Another scheme for altering the shape of the face of CCD wafer 1 is illustrated in FIG. 4. A number of torques are applied to package 2 via a series of torque wrenches, each referenced to a stationary reference 135 and consisting of a flexible leaf spring 5 made, for example, from aluminum, and a screw 6 used to apply a force to the end of the leaf spring. The geometry shown in FIG. 4 is for the case when the intrinsic shape of the face of CCD wafer 1 is convex. If the intrinsic shape CCD wafer 1 were concave, screws 6 would be designed to pull rather than push on the ends of leaf springs 5.

A third scheme for altering the shape of the face of CCD wafer 1 involves the application of a matrix of tension/compression stresses on the back of the substrate 2 onto which CCD wafer 1 is bonded. This is accomplished through the use of a base plate that is cemented to the back surface of the CCD/substrate assembly after the shape of the CCD/substrate assembly 1,2 has been adjusted.

Figure 5:
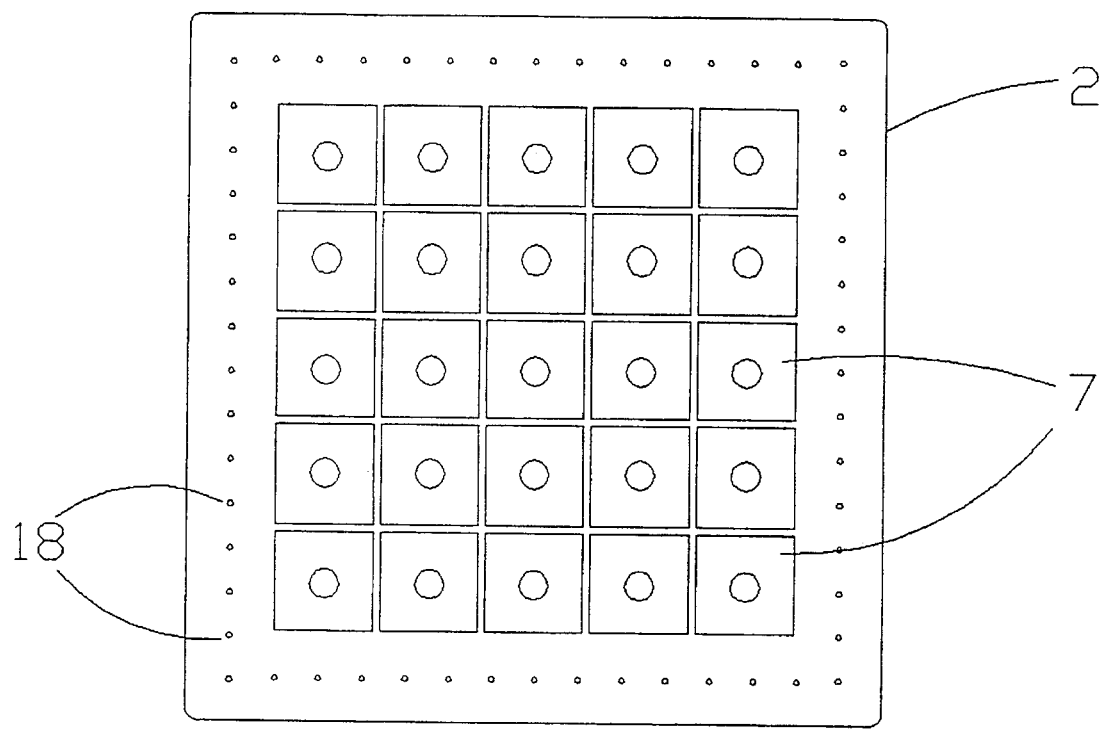
FIG. 5 shows the back side of a CCD package with a matrix of drilled and tapped pads attached to the package.
Figure 6:
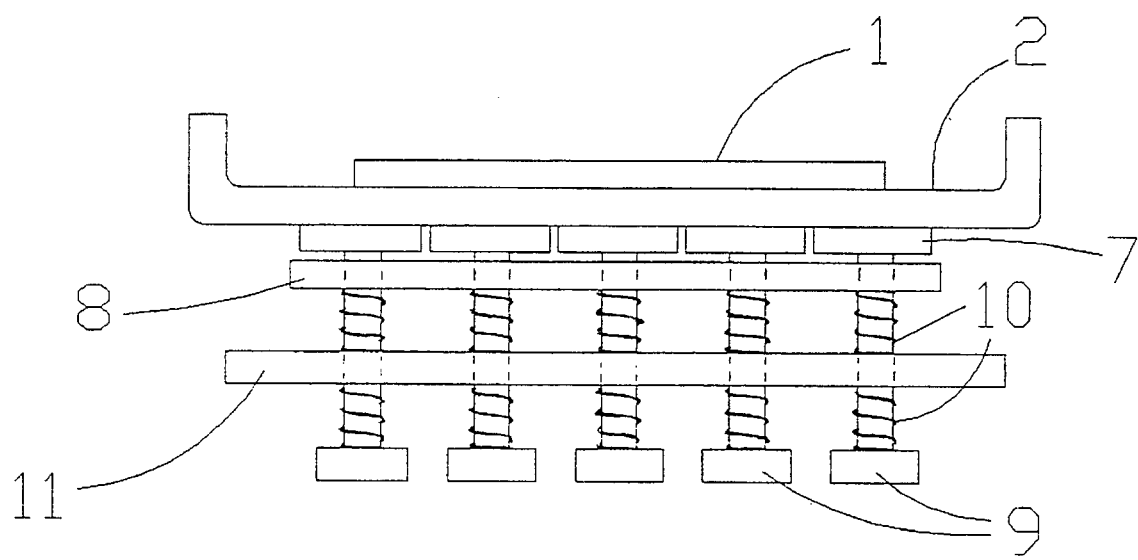
FIG. 6 shows a side view of the pads coupled to a reference plate through a series of spring-screw units.

Specifically, FIG. 5 shows a 5×5 array of threaded pads 7 attached to the back side of a CCD/substrate assembly 1,2. FIG. 6 shows the side view of pads 7, a base plate 8, reference screws 9, compression springs 10, and a reference plate 11. There are two springs 10 for each reference screw 9, separated by reference plate 11, which supports the entire array of spring-screw units 9,10. Each screw 9 can be operated in either a push or pull mode to effect relative compression or tension on the back surface of CCD substrate 2 via the threaded pads 7. The reference screws 9, springs 10, and reference plate 11 are removed after an adhesive bond between pads 7 and base plate 8 has cured. (It should be appreciated that in some cases threaded pads 7 might be integral with substrate 2.)

Any of the three foregoing techniques for changing the shape of the face of CCD wafer 1 can be used in conjunction with an interferometer 25 (FIG. 7) to aid in producing a match between the surface of CCD wafer 1 and the surface of fiber optic bundle 20. CCD wafer 1 and fiber optic bundle 20 each are placed in a different leg of interferometer 25. The resultant fringe pattern represents the variations in the gap between the surface of CCD wafer 1 and the face of fiber optic bundle 20. Thus, the fringe pattern also represents the degree to which the respective profiles are complementary to each other. (The term "profile" as used herein is intended to refer to a three-dimensional profile of a surface.) Through inspection of the resultant fringe pattern, the face shape of CCD wafer 1 can be adjusted until a null pattern is obtained from the interferometer indicating that the face shape of CCD wafer 1 now matches the corresponding face of fiber optic bundle 20 in the sense that the two face shapes are exactly complementary to each other.

After the desired shape of the CCD wafer face is achieved through either of the first two foregoing techniques, the thermal compensation plate 3 of appropriate material and thickness is cemented on the back side of substrate 2 on which CCD wafer 1 is bonded. Thermal compensation plate 3 maintains the shape of CCD wafer 1 and stabilizes the face of CCD wafer 1 against shape changes as the temperature of the system is changed in the same manner as in the embodiment of FIG. 2.

In the third above described technique, an adhesive material (such as Eccobond 285 or Stycast 2850FT) attaching base plate 8 (FIG. 6) to the pads 7 is cured, and base plate 8 thus functions in the same manner as the stabilizing and thermal compensation plate 3 in FIG. 2.

The procedures described above for matching the faces of the CCD wafer 1 and the last optical element are much more cost-effective than shaping the face of the fiber optic bundle 20, and are practical for use in a production-line environment. After having matched the shape of CCD wafer 1 to the fiber optic bundle 20 and stabilized its shape with a thermal compensation plate (through any one of the three above described techniques), it is now possible to create a bond with a uniform layer of optical material 4. Thus, there is no loss in imaging resolution due to non-uniformities in thickness of the optical coupling material.

Figure 7:
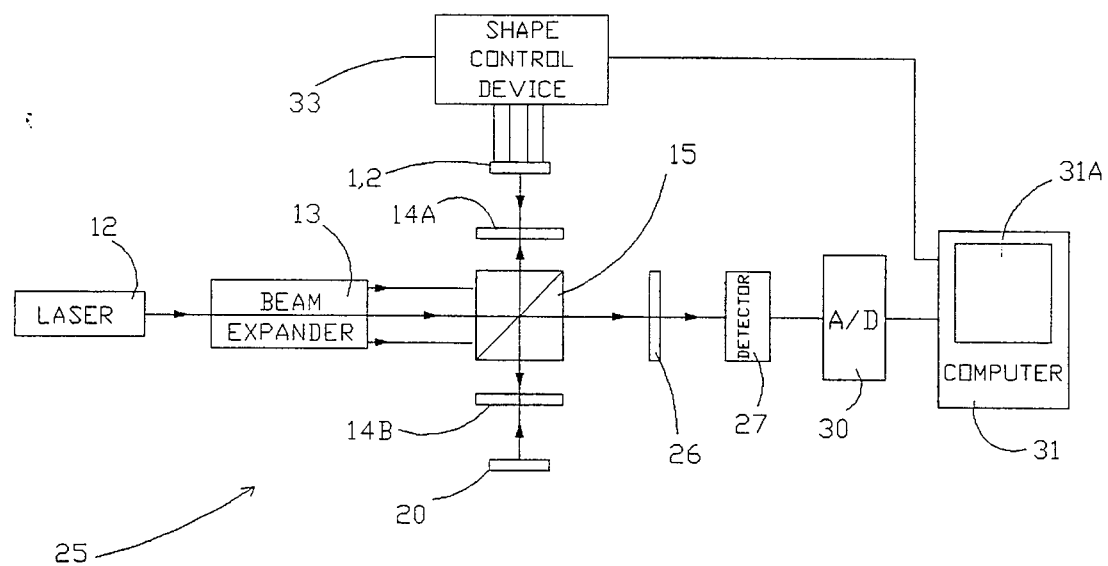
FIG. 7 shows the schematic of an interferometer used to aid in matching the CCD face shape to the face shape of the mating optical element.

FIG. 7 shows a schematic drawing of an interferometer 25 used to assist in "matching" the face shape of CCD wafer 1 to an end face of fiber optic bundle 20. Interferometer 25 includes a polarized laser 12, a beam expander 13, a polarizing beam splitter 15, two quarter-wave plates 14A and 14B, a polarizing sheet or analyzer 26, and a detector 27. The surfaces of CCD/substrate assembly 1,2 (with the surface of CCD wafer 1 facing beam splitter 15) and fiber optic bundle 20 (with its mating face oriented toward beam splitter 15) are to be matched. Collimated light exits beam expander 13 with a diameter large enough to illuminate the entire surface of CCD wafer 1 and impinges upon polarizing beam splitter 15.

Beam splitter 15 transmits horizontally polarized light towards detector 27 and reflects vertically polarized light to quarter-wave plate 14A which transmits circularly polarized light to the surface of CCD wafer 1. Upon return from the surface of CCD wafer 1, the circularly polarized light travels through quarter-wave plate 14A again and becomes horizontally polarized.

Thus, all of the light reflected from the surface of wafer 1 is transmitted through the beam splitter 15 as a result of being horizontally polarized and then passes through quarter-wave plate 14B and becomes circularly polarized before arriving at the mating surface of fiber optic bundle 20. Upon reflection from the mating surface of fiber optic bundle 20, the circularly polarized light travels back through the quarter-wave plate 14B and is then vertically polarized. All of this vertically polarized light beam then is reflected by beam splitter 15 through a polarizing sheet or analyzer 26. The analyzer 26 is used to combine the information from both this vertically polarized beam and the originally transmitted horizontally polarized beam, as both beams travel toward detector 27.

The analog signals produced by detector system 27 are converted to digital signals by an analog-to-digital converter 30 to input corresponding digital image information representing the interferogram of variations in the gap between the surface of CCD wafer 1 and the end face of fiber optic bundle 20 to computer 31. Computer 31 can be a conventional PC computer such as an IBM Pentium-based or 86486-based PC or compatible, executing conventional commercially available interferometry software, such as the software sold under the trademark "FAST! V/AI", available from Phase Shift Technology of Tucson, Ariz. In a production line environment, computer 31 can be programmed to generate control signals that are input to a control device 33 that adjusts the above described heating elements 4 of FIG. 2, torque wrench devices 6 of FIG. 4, or reference screws 9 of FIG. 6 so as to produce a null fringe pattern on monitor 31A of computer 31.

The resultant fringe pattern is a measure of the degree to which the surface of CCD wafer 1 and the mating surface of fiber optic bundle 20 are complementary to each other. If detector element 27 is a video camera, one can look at a monitor and adjust the shape of the surface of CCD wafer 1 using one of the techniques described above until a "null" fringe pattern indicates that the two surfaces are matched to within chosen specifications. (A perfect complementary surface match produces a "null" fringe pattern, that is, a single dark or bright fringe which covers the entire surface of CCD wafer 1.) Although each of the three above described techniques for changing the shape of the face of CCD wafer 1 can perform satisfactorily, the third technique using the matrix of tension/compression stresses may be best suited to a production-line environment.

After the shape of the face of CCD wafer 1 has been properly adjusted according to the first or second technique described above, the thermal compensation plate 3 of appropriate material is adhesively attached to the back side of the substrate 2 opposite to CCD wafer 1. Thermal compensation plate 3 is chosen so that it has a correct combination of thermal coefficient of expansion, Young's modulus of elasticity, and thickness needed to stabilize the assembly including CCD wafer 1 bonded to one surface of substrate 2 and compensation plate 3 bonded to the other face of substrate 2 with respect to changes in shape which otherwise would occur with changes in temperature. When the adhesive has fully set, the unit including the package substrate 2 and CCD wafer 1 maintains its new shape after the resistors 4 or the torque wrenches 6 are removed, whereupon the assembly then is completed and encapsulated with a hermetic seal.

If the above described third technique is used, the base plate 8 in FIG. 6 functions as the thermal compensation plate. Epoxy or cement is placed on the base plate 8, and the assembly including CCD wafer 1 bonded to substrate 2 then is adjusted to provide the desired shape of the front face of CCD wafer 1 before the epoxy or cement cures. After the epoxy or cement cures, the spring-screw units 9 and 10 and the reference plate 11 can be removed from the matrix of pads 7, leaving only pads 7 and the thermal compensation plate 8 attached to the CCD/substrate assembly 1,2 and maintaining the desired shape of the front face of CCD wafer 1.

After thermal compensation plate 3 or 8 is applied and the adhesive is cured, the outer face of CCD wafer 1 of CCD/substrate assembly 1,2 and the end face of fiber optic bundle 20 are then bonded together with optical coupling material 4, taking care to align the two pieces correctly and to create a uniform gap filled with the optical-coupling material 4. The gap size should be less than approximately one-half the size of the pixel elements of CCD wafer 1 to ensure no more than minimal degradation of the MTF of the system.

The thermal compensation plate 3 or 8 stabilizes the CCD/substrate assembly with respect to shape changes that would ordinarily occur with temperature change.

Figure 8:
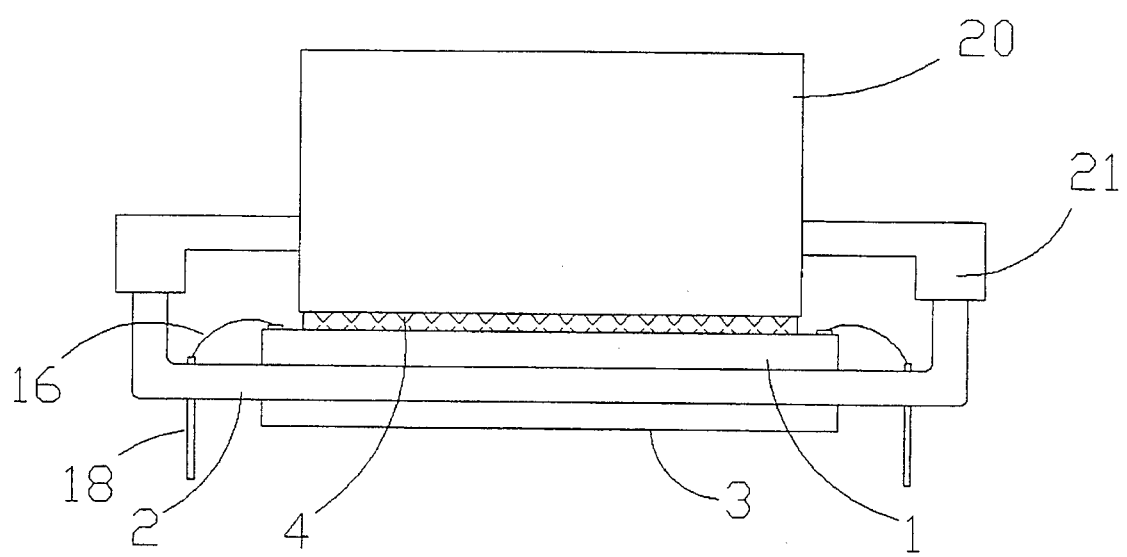
FIG. 8 shows a CCD water bonded to a fiber optic bundle with a hermetic seal protecting the bonding wires.

The present invention also addresses stresses produced due to the large thermal expansion coefficient of the coupling material. In systems having a hermetic seal to protect CCD wafer 1 and bonding wires 16 and also to provide mechanical support, the design of the hermetic seal (such as 21 in FIG. 8) is such that it produces mechanical coupling between CCD/substrate 1,2 assembly and fiber optic bundle 20. The effective thermal coefficient of expansion for the mechanical coupling material of such a hermetic seal typically is one to two orders of magnitude less than that for the optical-coupling material 4. In such a system, CCD/substrate assembly 1,2, optical-coupling material 4, fiber optic bundle 20, and hermetic seal 21 is an "overconstrained" system producing a stress in the optical-coupling material 4 as the temperature is lowered. Such stresses cause potentially far more serious problems than if there were no hermetic seal.

According to the present invention, the shear stress in the interface bonding between optical-coupling material 4 and the surfaces of the fiber optic bundle 20 and CCD wafer 1 of the desired system can be significantly reduced by appropriately compressing the optical coupling material 4 as the temperature is lowered. One way of producing such compressional stress is to create the hermetic seal in such a fashion that it causes a compression of optical coupling material 4 as the temperature is lowered. This is accomplished by introducing into the mechanical structure of the hermetic seal 21 an element which has a thermal coefficient of expansion larger than the effective thermal coefficient of expansion for CCD/substrate assembly 1,2 and fiber optic bundle 20.

For a given thickness of optical-coupling material 4, it is possible to choose the thickness of such element so that the net change in the volume of optical-coupling material 4 due to temperature change is manifested as only a thickness change thereof, and the cross sectional area of optical coupling material 4 remains constant and equal to the interface area between it and CCD wafer 1. Thus, there is no shear stress generated by the high thermal coefficient of expansion for the bonding element at either the bonding surface of the CCD wafer or its mating fiber optic bundle 20.

Figure 9:
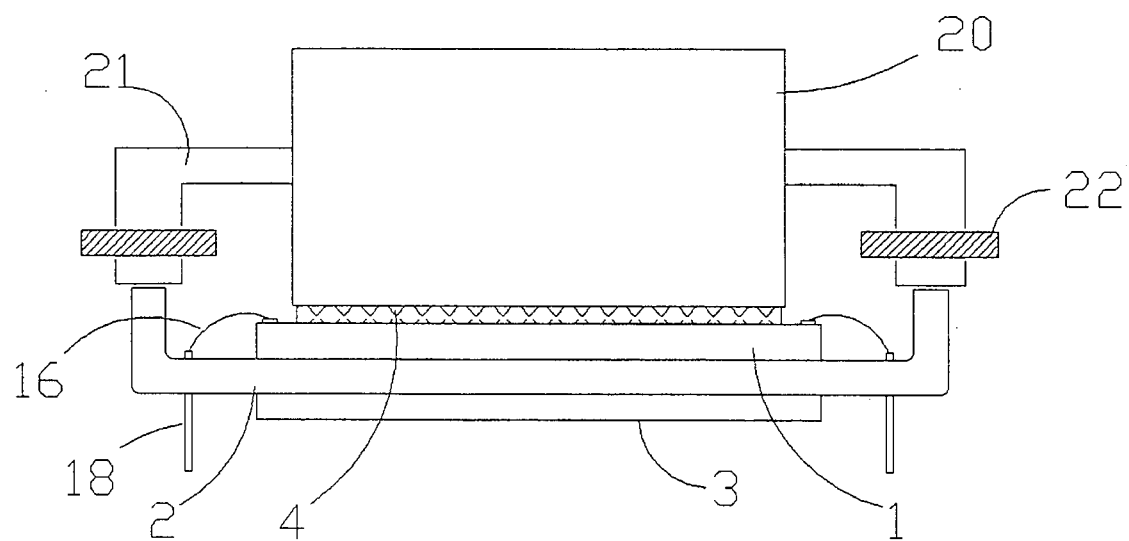
FIG. 9 shows a CCD wafer bonded to a fiber optic bundle with a hermetic seal that employs a thermal compensation piece.

For example, in FIG. 9 CCD wafer 1 is contained within a hermetically sealed region bounded by substrate 2, fiber optic bundle 20, and a hermetic seal structure 21 which includes a thermal compensation piece 22. Hermetic seal 21 provides a rigid mechanical coupling between the CCD unit and the mating optical element 20. Thermal compensation piece 22 is chosen to have a higher thermal coefficient of expansion than the effective thermal coefficient of expansion of CCD/substrate assembly 1,2 and mating optical element 20. Hermetic seal 21 is cemented or epoxied onto substrate 2 and fiber optic bundle 20 and sets or cures at room temperature.

Then, as the temperature is lowered the optical coupling material 4 experiences a compression type of stress since thermal compression plate 22 shrinks more than the other mechanical elements. Thermal compression piece 22 can be specifically chosen to have a thermal coefficient of expansion and thickness such that the net volume change of the optical-coupling element 4 due to a temperature change is manifested as only a thickness change thereof. This prevents the generation of shear stress at either the bonding surface of CCD wafer 1 or the mating optical element 20 due to the large thermal coefficient of expansion of the optical-coupling element 4. (However, the stress produced by unmatched thermal coefficients of expansion for the CCD wafer 1 and the mating optical element 20 remains present.)

Another way in which compression stress can be introduced in the optical coupling material 4 to reduce the interface stress that occurs during thermal cycling is to "prestress" the optical coupling material 4 at room temperature while the hermetic seal 21 is setting or curing. This "pre-biases" the thickness of the optical coupling material 4 to a slightly smaller value at room temperature. As the system is cooled below room temperature to achieve low-noise operation, the shrinkage of the optical coupling material 4 then causes its thickness to decrease from the pre-biased value, perhaps to the thickness at which there is zero shear stress or less. In any event, the magnitude of the maximum interface bonding shear stress due to thermal cycling is substantially reduced, by a factor of as much as two.

Figure 10:
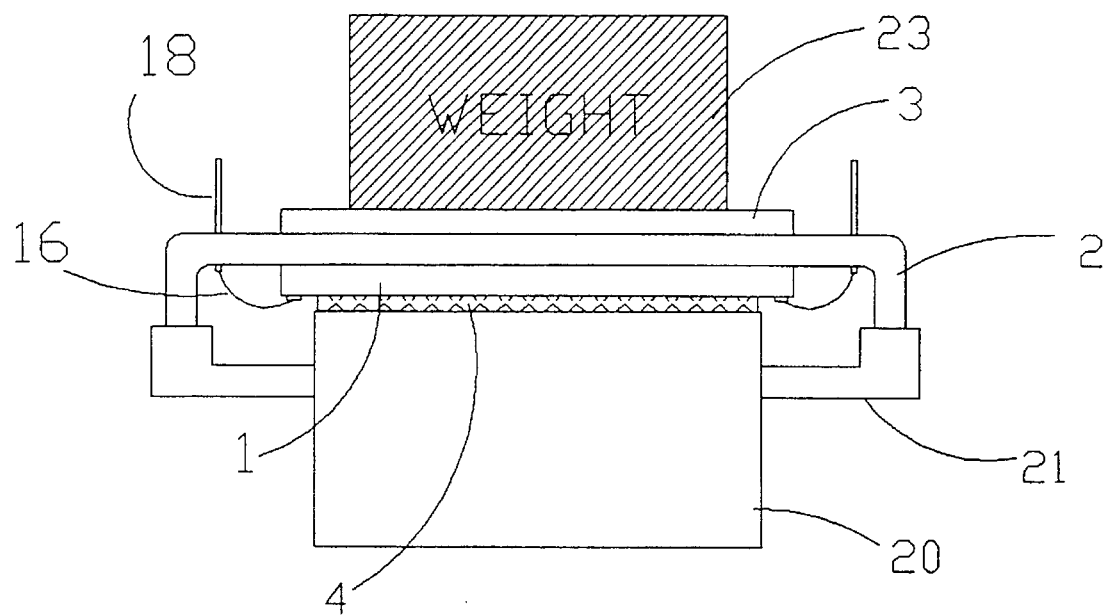
FIG. 10 illustrates the application of a weight to bias an optical coupling element during the cementing of a hermetic seal to create a compression stress in the optical-coupling element.

FIG. 10 illustrates the foregoing method of achieving a compression stress of optical-coupling material 4. When hermetic seal 21 is first applied and before it cures or sets, a weight (or force) 23 is applied to the back of CCD/substrate 1,2 while it rests on the surface of mating optical element 20. Weight 23 compresses optical-coupling material 4. After hermetic seal 21 cures, weight 23 is removed, and the room temperature "pre-biased" decreased thickness is maintained by the rigid structure of hermetic seal 21.

One may utilize either the technique of introducing a thermal compensation element in the hermetic seal or the prestressing technique, or both techniques, to significantly reduce the shear stress developed in the interface bonds between the optical coupling element 4 and the surfaces of fiber optic bundle 20 and CCD wafer 1 as the temperature is lowered.

Should the interface bonding fail, the use of clear room-temperature vulcanized silicone rubber (RTV) as the optical-coupling material 4 allows for CCD/substrate assembly 1,2 to be separated from fiber optic bundle 20 without damage to CCD wafer or fiber optic bundle 20. If the device fails in the field, it can be returned and rebonded without having to replace the expensive CCD wafer 1 or, during production of these units, if the bonded assembly does not have the optical integrity required to meet specifications, it can be taken apart and rebonded.

An optical-coupling element consisting of RTV has another advantage over an epoxy-type of optical-coupling element when a hermetic seal is used with or without a temperature compensating element or when the technique of prestressing the optical-coupling material is used. For an epoxy-type optical-coupling element and a hermetic seal with a temperature compensating element, the required compression stress on the optical-coupling material, and hence on the CCD wafer, has a temperature coefficient of the order of 50 psi/°C. For example, where the CCD wafer is operated at −10° C. with a room temperature of 20° C., the compression stress required to compensate for thermal effects typically would be in excess of 1500 psi. Such stress on the CCD wafer may be undesirable. For an RTV optical-coupling element with a Young's modulus of elasticity of the order of 1000 psi, the temperature coefficient for the compression stress on the CCD wafer is approximately 0.5 psi/°C. Thus, for a change in temperature of 30° C., the resulting necessary compression stress is only about 15 psi.

The use of clear RTV can reduce the necessary compression stress when using thermal compensation piece 22 of FIG. 9 as part of the hermetic seal 21 or when using the technique of prestressing the optical-coupling material 4 as in FIG. 9. The lower Young's Modulus of elasticity of the RTV allows a factor of approximately 100 reduction in necessary compression stress to compensate for volume changes in the epoxy with temperature. Furthermore, should the system fail, the use of RTV allows one to separate the CCD/substrate unit 1,2 from the mating optical element 20 without damage to either the CCD wafer 1 or the mating optical element 20. After separation, CCD wafer 1 and mating optical element 20 can be cleaned and rebonded, if desired.

It should be understood that during the curing process of the optical-coupling element 4, typical volume shrinkages of optical-coupling material 4 ordinarily create shear stresses therein, increasing the probability for failure of the interface bonding between optical coupling material 4 and the surfaces of fiber optic bundle 20 and CCD wafer 1.

Figure 11:
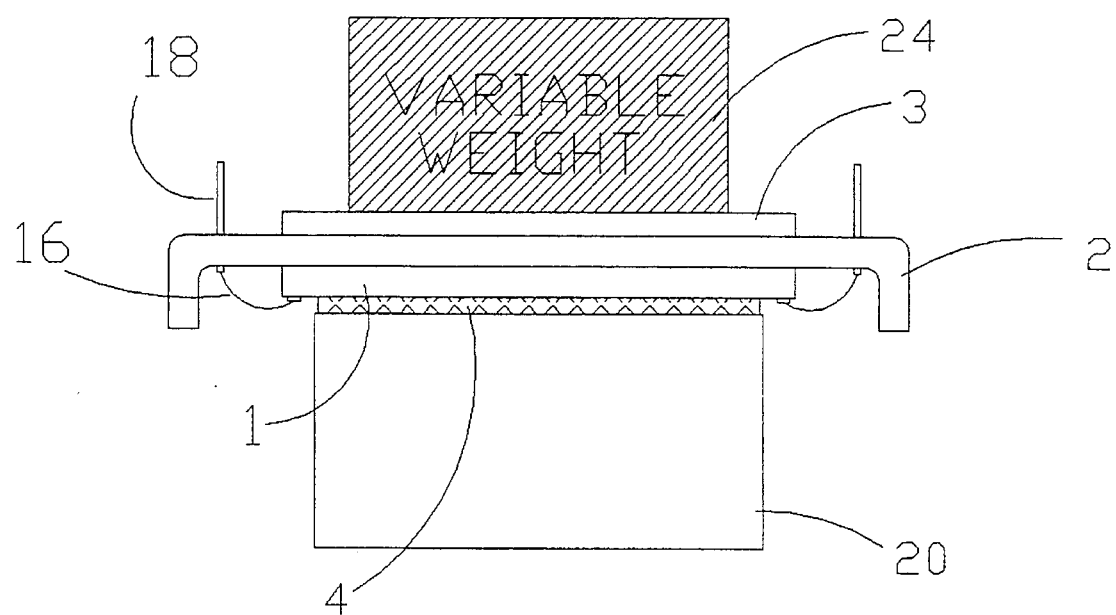
FIG. 11 illustrates the application of a variable weight or external force to bias an optical coupling element during curing of an optical bond coupling material so as to maintain the cross sectional area of each "slice" of the optical bond coupling material essentially constant.

However, a technique of the present invention that alleviates this problem involves compressing or prestressing optical-coupling material 4 during the curing process so as to have the net percentage volume change in optical-coupling material equal to the net percentage change in thickness of the optical-coupling material 4, to thereby prevent changes in the cross-sectional area of each hypothetical "slice" of the optical-coupling material parallel to the bonded surfaces. The compression force required is low at the beginning of the curing process and increases as the optical-coupling material 4 hardens. To achieve this, the weight or clamping force can be increased as the curing progresses. FIG. 11 shows the application of a variable weight or external variable force to accomplish this.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, the invention is as equally applicable to an array of light emitting diodes as to photosensing devices such as CCDs. It should be appreciated that although CCD devices are included in the above embodiment, other optical sensing devices, such as CIDs (charge injection devices), can present the same bonding problems as CCD devices, and the solutions described herein therefore are equally applicable to such other optical sensing devices.

What is claimed is:

1. A high resolution optical device, comprising in combination:

(a) a semiconductor wafer having on a front surface thereof an array of photosensitive elements, the semiconductor wafer having a first thermal coefficient of expansion;

(b) a substrate, a back surface of the semiconductor wafer being bonded to a first surface of the substrate, the substrate having a second thermal coefficient of expansion substantially different than the first thermal coefficient of expansion;

(c) a thermal compensation plate bonded to a second surface of the substrate, the thermal compensation plate having a third thermal coefficient of expansion and a thickness selected to prevent the semiconductor wafer, substrate, and thermal compensation plate from bowing with variation of the temperature of the semiconductor wafer, substrate, and thermal compensation plate by causing the thermal compensation plate to offset stresses produced in the semiconductor wafer and the substrate due to differential thermal expansion and contraction of the semiconductor wafer and substrate; and (d) a fiber optic bundle having a mating face and optical coupling material attaching the mating face to the front surface of the semiconductor wafer, thereby forming a first bonding interface between the optical coupling material and the front surface of the semiconductor wafer and a second bonding interface between the optical coupling material and the mating face, whereby stresses at at least one of the first and second bonding interfaces due to thermal cycling of the semiconductor wafer and the substrate are reduced.

2. The high resolution optical device of claim 1 wherein the optical coupling material is epoxy.

3. The high resolution optical device of claim 1 wherein the optical coupling material is RTV material.

4. The high resolution optical coupling device of claim 1 wherein the photosensitive elements include photodetectors.

5. The high resolution optical device of claim 1 including a rigid hermetic sealing structure engaging a wall of the fiber optic bundle and the substrate to form a hermetic seal therewith to protect wire bonds between the semiconductor wafer and leads associated with the substrate and to provide mechanical support to the substrate and semiconductor wafer, the hermetic sealing structure including a layer of thermal compensation material having a thickness and a thermal coefficient of expansion selected to compensate thermal expansion and contraction of the volume of the optical coupling material by adjusting the thickness of the optical coupling material in the same proportion as the volume change.

6. The high resolution optical device of claim 1 including a rigid hermetic sealing structure engaging a wall of the fiber optic bundle and the substrate to form a hermetic seal therewith, wherein the optical coupling material exerts a predetermined opposite prestress force against the front surface of the semiconductor wafer and the mating face of the fiber optic bundle, the prestress force being resisted by the hermetic sealing structure.

7. The high resolution optical device of claim 5 wherein the optical coupling material exerts a predetermined opposite prestress force against the front surface of the semiconductor wafer and the mating force of the fiber optic bundle, the prestress force being resisted by the hermetic sealing structure.

8. The high resolution optical device of claim 1 wherein the fiber optic bundle is one of the group consisting of a lens and an image intensifier.

9. The high resolution optical device of claim 1 wherein the offsetting of the stresses in the semiconductor wafer and the substrate reduces the stresses at the bonding interfaces and in the optical coupling material due to volume shrinkage of the optical coupling material.

10. A high resolution optical device, comprising in combination:
(a) a first substrate having a photosensitive front surface, the first substrate having a first thermal coefficient of expansion;
(b) a second substrate, a back surface of the first substrate being bonded to a first surface of the second substrate, the second substrate having a second thermal coefficient of expansion substantially different than the first thermal coefficient of expansion;
(c) a thermal compensation plate bonded to a second surface of the second substrate, the thermal compensation plate having a third thermal coefficient of expansion and a thickness selected to prevent the first substrate, second substrate, and thermal compensation plate from bowing with variation of the temperature of the first substrate, second substrate, and thermal compensation plate by causing the thermal compensation plate to offset stresses produced in the first substrate and the second substrate due to differential thermal expansion and contraction of the first substrate and the second substrate; and
(d) a fiber optic bundle having a mating face and optical coulping material attaching the mating face to the front surface of the semiconductor wafer, thereby forming a first bonding interface between the optical coupling material and the front surface of the semiconductor wafer and a second bonding interface between the optical coupling material and the mating face, whereby stresses at least one of the first and second bonding interfaces due to thermal cycling of the semiconductor wafer and the substrate are reduced.

11. An optical apparatus, comprising in combination:
(a) a semiconductor wafer having a front surface and a back surface and an array of photosensitive elements on the front surface;
(b) a substrate having a first surface and a second surface, the back surface of the semiconductor wafer being bonded to the first surface of the substrate, the substrate having a plurality of edge portions;
(c) a plurality of substrate-adjusting elements engaging the edge portions, respectively, the substrate-adjusting elements being adapted to develop localized forces on the edge portions to produce controlled amounts of bowing of the substrate as necessary to produce a predetermined degree of flatness of the front surface of the semiconductor wafer; and
wherein each of the substrate-adjusting elements includes a heating element thermally coupled to an associated edge portion, the heating element locally heating the associated edge portion and producing thermal expansion resulting in the localized forces.

12. An optical apparatus, comprising in combination:
(a) a semiconductor wafer having a front surface and a back surface and an array photosensitive elements on the front surface;
(b) a substrate having a first surface and a second surface, the back surface of the semiconductor wafer being bonded to the first surface of the substrate, the substrate having a plurality of edge portion;
(c) a plurality of substrate-adjusting elements engaging the edge portions respectively, the substrate-adjusting elements being adapted to develop localized forces on the edge portions to produce controlled amounts of bowing of the substrate as necessary to produce a predetermined degree of flatness of the front surface of the semiconductor wafer; and
wherein each of the substrate-adjusting elements includes a torque-producing element engaging an associated edge portion, the torque-producing element being adjustable to produce the localized forces.

13. The optical apparatus of claim 11 wherein the semiconductor wafer is square and the substrate has four flanged edges each continuous with two of the other flanged edges.

14. An optical apparatus, comprising in combination:
(a) a semiconductor wafer having a front surface and a back surface and an array of photosensitive elements on the front surface;
(b) a substrate having a first surface and a second surface, the back surface of the semiconductor wafer being bonded to the first surface of the substrate;
(c) a plurality of pads attached to the second surface of the substrate, each pad having a threaded hole therein;
(d) a thermal compensation plate having a plurality of clearance holes aligned with the threaded holes, respectively; and
(e) bonding material attaching the thermal compensation plate to the pads,
whereby a plurality of reference screws engaging a reference plate can be used to apply various localized forces to the various pads to produce a predetermined profile of the front face of the semiconductor wafer before the bonding material cures to fix the predetermined profile into the front face of the semiconductor wafer.

* * * * *